United States Patent
Kudelka et al.

(10) Patent No.: US 6,295,998 B1
(45) Date of Patent: *Oct. 2, 2001

(54) TEMPERATURE CONTROLLED GASSIFICATION OF DEIONIZED WATER FOR MEGASONIC CLEANING OF SEMICONDUCTOR WAFERS

(75) Inventors: Stephan Kudelka, Fishkill; David Rath, Stormville, both of NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/318,155

(22) Filed: May 25, 1999

(51) Int. Cl.$^7$ ................... B08B 3/12; B08B 3/10
(52) U.S. Cl. ................... 134/1.3; 134/2; 134/36; 134/42
(58) Field of Search ................... 134/1, 1.3, 21, 134/36, 42, 2

(56) References Cited

U.S. PATENT DOCUMENTS

| | | | |
|---|---|---|---|
| 4,865,060 | * | 9/1989 | Shibano ................... 134/60 |
| 4,907,611 | * | 3/1990 | Shibano ................... 134/60 |
| 5,144,831 | * | 9/1992 | Hale et al. ............... 73/19.05 |
| 5,176,756 | * | 1/1993 | Nakashima et al. ........ 134/2 |
| 5,656,097 | * | 8/1997 | Olesen et al. ............. 134/1 |
| 5,800,626 | * | 9/1998 | Cohen et al. .............. 134/1.3 |
| 6,039,055 | * | 3/2000 | Akatsu .................... 134/1.3 |

\* cited by examiner

*Primary Examiner*—Randy Gulakowski
*Assistant Examiner*—Saud Chaudhry
(74) *Attorney, Agent, or Firm*—Stanton C. Braden, Esq.

(57) ABSTRACT

A system is provided to prepare deionized water having a 100% saturated concentration of a gas, e.g., nitrogen, at a hot temperature, e.g., 50–85° C., and an attendant pressure, e.g., atmospheric pressure, to clean a semiconductor wafer, e.g., of silicon. The gas concentration of a first deionized water portion having a predetermined concentration of the gas at a cold temperature, e.g., 20–30° C., is adjusted in a gassifier chamber having a pressure pump and a pressure sensor, to provide a predetermined under-saturated concentration of the gas at the cold temperature. The temperature of the adjusted gas concentration first water portion is then adjusted by mixing therewith a second deionized water portion having a predetermined concentration of the gas at a predetermined very hot temperature, e.g., 80° C., in a predetermined ratio in a mixer having a temperature sensor. The flows of the first and second water portions are controlled by first and second flow controllers, to form a hot bath at the hot temperature having such saturated gas concentration to clean the wafer, e.g., in a cleaning tank under megasonic vibrations. A controller is connected to the pump, pressure sensor, temperature sensor and first and second flow controllers to control the chamber pressure and the operation of the flow controllers.

21 Claims, 1 Drawing Sheet

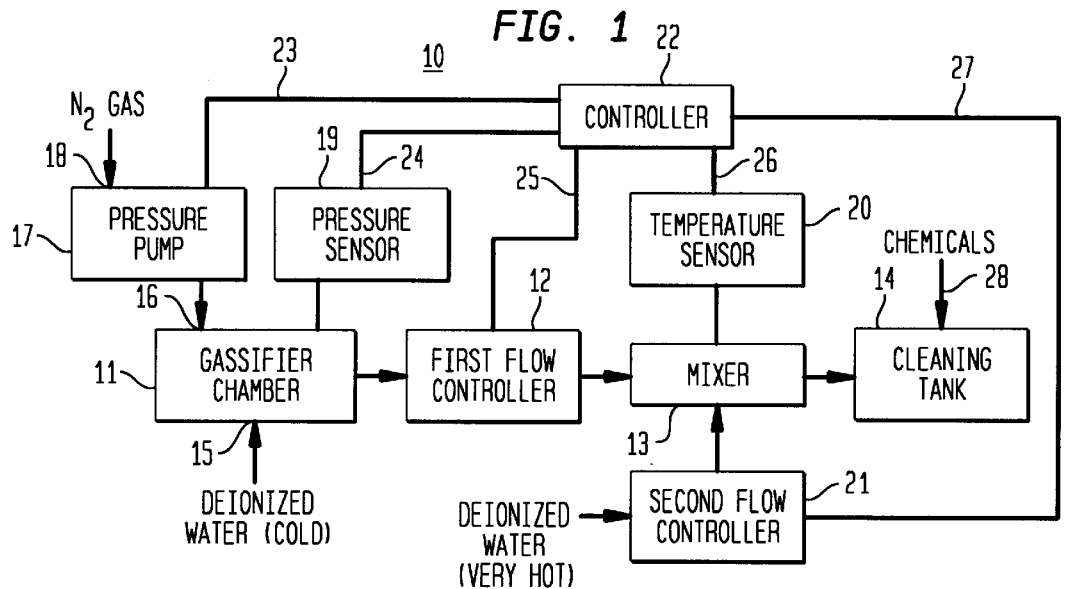
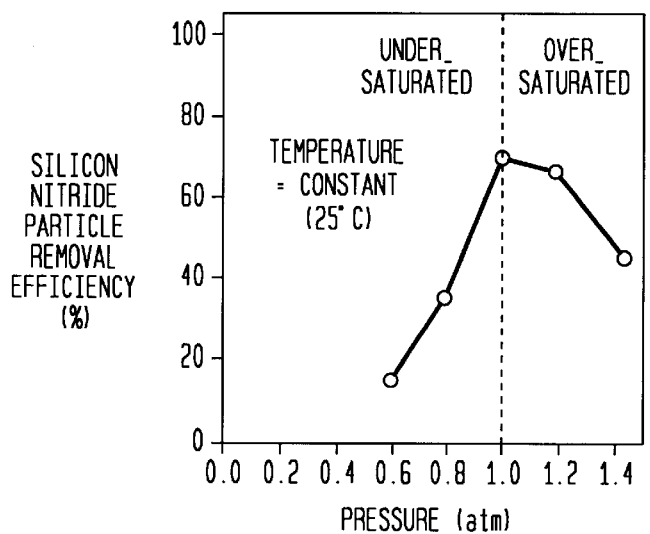
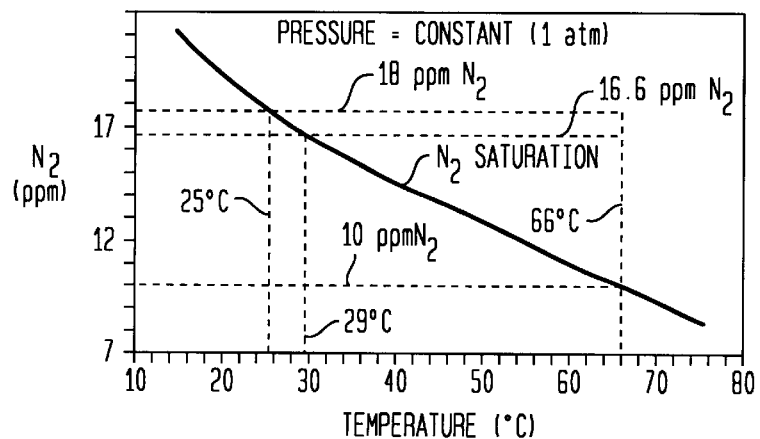

TEMPERATURE CONTROLLED GASSIFICATION OF DEIONIZED WATER FOR MEGASONIC CLEANING OF SEMICONDUCTOR WAFERS

CROSS-REFERENCE TO RELATED PATENT APPLICATION

This patent application is related to U.S. patent application Ser. No. 09/318156, filed simultaneously herewith (Siemens 99 P 7607 US—S. Kudelka and D. L. Rath), which has a common assignee and a common inventorship with this application, and which is entitled "TEMPERATURE CONTROLLED DEGASSIFICATION OF DEIONIZED WATER FOR MEGASONIC CLEANING OF SEMICONDUCTOR WAFERS".

FIELD OF THE INVENTION

This invention relates to a system, including a method and an apparatus arrangement, for temperature controlled gassification of deionized water for megasonic cleaning of semiconductor wafers, and more particularly, to such a system for preparing deionized water containing a substantially 100% saturated concentration of a non-reactive cleaning enhancing gas dissolved therein at a selective elevated cleaning temperature and selective attendant cleaning pressure for cleaning a semiconductor wafer, e.g., of silicon.

As used herein, "non-reactive" cleaning enhancing gas means any gaseous substance capable of being dissolved in deionized water for enhancing the cleaning of, e.g., particle, contaminants from a semiconductor wafer without reacting (i.e., being inert to chemical reaction) with any constituents present in the water or in or on the semiconductor wafer.

Also, as used herein, "semiconductor wafer" means any microelectronic device, substrate, chip or the like, e.g., of silicon, used to provide an integrated circuit or other related circuitry structure subject to contaminant particle removal and cleaning chemistry procedures.

BACKGROUND OF THE INVENTION

In fabricating microelectronic semiconductor devices and the like on a wafer substrate or chip, e.g., of silicon, to form an integrated circuit (IC), etc., various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions.

One type of wet chemical process used in the IC fabrication of a semiconductor wafer concerns the cleaning of the wafer to remove contaminant particles from its surface. This may be effected by immersing the wafer in a hot deionized water cleaning bath subjected to rapid agitation such as by applying non-reactive cleaning enhancing (bubble generating) gas, e.g., nitrogen ($N_2$), and/or megasonic vibrations thereto.

For overall cleaning of the wafer, e.g., of silicon, a so-called "RCA clean" process has been used wherein the wafer is treated with two cleaning agents in sequence comprising an alkaline, so-called SC1 (standard clean 1), solution, e.g., of hydrogen peroxide ($H_2O_2$) and ammonium hydroxide ($NH_4OH$) in deionized water, such as for removing organic and particulate contaminants, in a first step, and then an acidic, so-called SC2 (standard clean 2), solution, e.g., of hydrogen peroxide and hydrogen chloride (HCl) in deionized water, such as for removing metallic impurities, in a second step. Each treatment step is effected, e.g., for about 10–20 minutes at about 75–85 °C., and is followed by a rinse step typically using hot deionized water. The wafer is usually dried in a drying step after the final rinse step.

For removing particles in particular, a traditional SC1 mixture of deionized $H_2O/H_2O_2/NH_4OH$ at a volume ratio of about 5:1:1 has been used to clean the wafer such as at about 65° C. for about 10 minutes. The high concentrations of the SC1 chemicals in the solution and high temperature used cause removal of most particles by etching the wafer surface and the particles to some extent, thus reducing the particle adhesion forces with the wafer and promoting particle movement away from the wafer and into the bulk of the solution. The high pH of the SC1 solution also induces negative charges on the wafer and particles, providing a mutual repulsion tending to keep loosened particles from reattaching to the wafer surface. However, such traditional SC1 cleaning solution is expensive and too aggressive at many critical cleaning steps for use in currently available devices.

Recent introduction of megasonics assisting techniques into wafer cleaning processes has led to better particle removal efficiency with solutions substantially less aggressive and thus less harmful to the surface of the wafer, e.g., of silicon. The megasonic vibration assisting cleaning solutions are usually dilute versions of the traditional SC1 solution, and are used at widely varying temperatures depending on the effect sought. A typical dilute SC1 solution used in this regard is a mixture of deionized $H_2O/H_2O_2/NH_4OH$ at a volume ratio of about 100:0.9:0.5, wherein 98+% (100/101.4=98.6) is deionized water and only about 1.4% constitutes the active chemicals. Because almost all of the solution is water, the amount of gases dissolved therein will dominate the total gas concentration of the dilute SC1 mixture.

The exact mechanism by which megasonics assisting techniques enhance the particle removal operation is not fully understood at this time. However, as noted below, it is clear that the amount of dissolved gases in the cleaning solution is critical for effective cleaning, i.e., particle removal, to occur.

Some examples of methods of cleaning semiconductor wafers are shown in the following prior art.

U.S. Pat. No. 5,464,480 (Matthews), issued Nov. 7, 1995, discloses removing organic material, e.g., photoresist, from a semiconductor wafer in a tank with sub-ambient or chilled (1–15° C.) deionized water in which ozone ($O_3$) is diffused, and then rinsing the wafer with deionized water. While ozone has little solubility in deionized water at room temperature or higher temperature, it is stated to be sufficiently soluble therein at sub-ambient temperature to oxidize the organic material to insoluble gases. Megasonic transducers are used to agitate the ozonated deionized water in the tank.

For an RCA clean therein, the wafer is rinsed with deionized water, treated with ozonated deionized water in which ammonia ($NH_3$) is diffused to form an SC1 solution, and rinsed again. Next, hot (70° C.) deionized water is used to raise the tank temperature. Then, the wafer is treated with deionized water in which ozone gas and hydrochloric (i.e., hydrogen chloride, HCl) gas are diffused to form an SC2 solution, whereupon the wafer is finally rinsed with deionized water.

U.S. Pat. No. 5,714,203 (Schellenberger et al.), issued Feb. 3, 1998, discloses dipping a silicon wafer in an aqueous cleaning bath containing hydrogen fluoride (HF), which renders the wafer surface hydrophobic, and removing the wafer therefrom while subjecting the bath surface, or alternatively the removed and dried wafer, to a gaseous flow of an oxygen/ozone ($O_2/O_3$) gas mixture alone or in a carrier gas chemically inactive thereto, such as air, i.e., nitrogen, oxygen and carbon dioxide ($N_2$, $O_2$ and $CO_2$), or carbon dioxide, helium (He), neon (Ne), argon (Ar), krypton (Kr), xenon (Xe) or radon (Rn). When applied to the bath surface, the gaseous flow lowers the liquid surface tension to aid drying of the wafer, and when applied to the dried wafer, the gaseous flow hydrophilizes the wafer surface. The wafer surface is also hydrophilized if the cleaning bath contains ozone.

U.S. Pat. No. 5,569,330 (Schild et al.), issued Oct. 29, 1996, discloses chemically treating a semiconductor wafer in sequence in the same container with a liquid bath containing HF which renders the wafer surface hydrophobic, then with a liquid bath containing ozone which renders the wafer surface hydrophilic, while applying megasonic vibrations thereto in both treating steps, and finally drying the wafer. The wafer may also be intermediately dried between the treating steps.

U.S. Pat. No. 5,520,744 (Fujikawa et al.), issued May 28, 1996, discloses treating a silicon wafer in a hermetically sealed chamber in sequence with three constant temperature heated (e.g., 60° C.) chemical baths of deionized water, respectively containing (1) hydrogen peroxide and ammonia, (2) HF, and (3) hydrogen peroxide and HCl, and also with a deionized water rinsing bath after each chemical bath treatment. A vapor of an inactive gas and an organic solvent, e.g., nitrogen and isopropyl alcohol, is applied to the wafer after the last rinsing bath to lower the surface tension of the deionized water remaining thereon to aid drying of the wafer, which is effected under reduced pressure, while reducing adhesion of contaminant particles thereto.

U.S. Pat. No. 5,800,626 (Cohen et al.), issued Sept. 1, 1998 (having a common inventor herewith, and assigned to International Business Machines Corporation), discloses a method for controlling the effectiveness of megasonics assisted cleaning of a substrate of a microelectronics device with a cleaning solution containing deionized water and gas at a given process temperature. This is done by vacuum degassing the water and then adding gas, e.g., nitrogen, back thereto in an amount to provide a cleaning solution only partially, e.g., 60–98%, saturated with the gas at the given process temperature. The cleaning solution is a dilute solution of deionized $H_2O/H_2O_2/NH_4OH$, e.g., in a volume ratio of 10:1:1 to 1,000:2:1, respectively (SC1), or of deionized $H_2O/H_2O_2/HCl$, e.g., in a volume ratio of 10:0:1 to 1,000:1:1, respectively (SC2). A first portion of vacuum degassed deionized water and a second portion of at least partially gas saturated deionized water can be mixed in a ratio effective to provide the only partially gas saturated water used at the given process temperature.

Said U.S. Pat. No. 5,800,626 notes that a higher temperature or a lower applied pressure can reduce the amount of gas that can be dissolved in the solution, such that heating gas saturated water causes some of the dissolved gas to be expelled via bubbles. One danger is that having too much gas in a wafer cleaning solution can lead to formation of gas bubbles in hot deionized water per temperature driven saturation, causing defects in silicon surfaces. Also, the presence of oxygen in particular in deionized water can cause etching and roughening of hydrogen-terminated silicon surfaces since oxygen gas is considered reactive thereto although inert to oxide wafer surfaces. For these reasons, deionized water is typically provided in degassified form, and the degassified water regassified with a particular gas of specific solubility and temperature dependency to provide an only partially gas saturated water for use at the given process temperature. While the provision for only partially gas saturated water enables the substrate cleaning to be effected at lower megasonic power, lower temperature and much lower concentrations of chemicals, such preparation of only partially gas saturated water is limited to use at only one given process temperature.

The disclosure of said U.S. Pat. No. 5,800,626 is incorporated herein by reference.

It is clear that the gas concentration, i.e., of a non-reactive cleaning enhancing (bubble generating and agitating) gas, in deionized water used for megasonic cleaning of semiconductor wafers, e.g., of silicon, has a strong influence on particle counts, i.e., the amount of contaminating particles remaining after cleaning, compared to the original amount thereof present before cleaning.

In this regard, for hydrophilic wafers, e.g., using standard cleans SC1 and SC2, the usual application of megasonic vibrations requires the cleaning bath to have a high concentration of cleaning enhancing, i.e., agitation imparting, gas therein. On the other hand, for hydrophobic wafers, e.g., using HF processing, a high gas concentration in the cleaning bath, with consequent excessive formation of bubbles, is detrimental and usually results in high particle counts, i.e., high amounts of contaminating particles remaining on the wafer after cleaning. This is because gas bubbles tend to nucleate at, or migrate to, hydrophobic surfaces and deposit particles thereat. Hence, for hydrophobic wafers, a dilute, e.g., HF, solution is used having a dissolved gas content well below its saturation concentration.

Because dilute cleaning solutions are predominantly deionized water, particular attention must be paid to the amount of dissolved gas in the deionized water used in present day wet cleaning tools for cleaning semiconductor wafers.

In order to allow an optimum gas concentration in the liquid bath used for each treatment step in a given cleaning operation, e.g., of sequential washing and rinsing steps, present day wet cleaning tools used for such purposes are in some cases equipped with a gas adjustment component in the form of a gassifier/degassifier, such as a so-called contactor. The component is typically a sealed chamber divided by a gas permeable membrane into a liquid compartment (water space) and a gas compartment (gas space), with water being supplied to the water space.

When the component is used as a gassifier, gas is supplied to the gas space by a pump applied as a pressure pump and in turn via the membrane to the water at a selective positive pressure to adjust the concentration of the gas dissolved in the water by increasing such concentration. On the other hand, when the component is used as a degassifier, gas is removed from the water via the membrane and in turn from the gas space by the pump applied as a suction pump at a selective vacuum pressure to adjust the concentration of the gas dissolved in the water by decreasing such concentration.

The gassifier is usually positioned on the tool before, i.e., upstream of, the heater used to heat the, e.g., room temperature (cold) deionized water to the (hot) cleaning temperature, upon transfer thereto from the gassifier, prior to transfer of the water to the cleaning tank for semiconductor wafer cleaning. However, where both room temperature (cold) and preheated (very hot) deionized water supplies are available, the cold and very hot supplies can be mixed in predetermined proportions to provide water at the hot cleaning temperature.

However, none of the present day wet cleaning tools take into account that at higher temperatures, an over-saturation (super-saturation) of the gas in the deionized water of the cleaning bath can take place. This reduces significantly the megasonic vibration efficiency during the cleaning step.

It is desirable to have a system, including a method and an apparatus arrangement, permitting selective adjustment of the gas concentration in the deionized water before it is heated to a selective elevated cleaning temperature for cleaning semiconductor wafers under megasonic vibration action, so as to avoid inefficient over-saturation or under-saturation of the gas in the thusly heated deionized water.

SUMMARY OF THE INVENTION

The foregoing drawbacks are obviated in accordance with the present invention by providing a system, including a method and an apparatus arrangement, which permits selective adjustment of the gas concentration in the deionized water before it is heated to a selective elevated cleaning temperature for cleaning semiconductor wafers under megasonic vibration action, and thereby avoids inefficient over-saturation or under-saturation of the gas in the thereby heated deionized water. In particular, the concentration of the gas in the deionized water has to be controlled as a function of the cleaning process temperature for increased megasonic cleaning efficiency.

According to a first aspect of the invention, a method is provided for preparing deionized water containing a substantially 100% saturated concentration of a non-reactive cleaning enhancing gas dissolved therein at a selective elevated cleaning temperature and a selective attendant cleaning pressure for cleaning a semiconductor wafer, e.g., of silicon.

The method comprises the steps of:
  adjusting the dissolved non-reactive cleaning enhancing gas concentration of a first portion of deionized water having a predetermined initial concentration of such gas dissolved therein and a predetermined initial lower temperature to provide a predetermined under-saturated adjusted concentration of the gas dissolved therein at such initial lower temperature; and
  adjusting the temperature of the resulting adjusted gas concentration first portion of deionized water by mixing therewith in a predetermined ratio a temperature adjusting quantity of a second portion of deionized water having a predetermined initial concentration of such gas dissolved therein and a predetermined initial higher temperature, sufficiently to form a hot bath of deionized water containing the substantially 100% saturated concentration of the gas dissolved therein at the cleaning temperature and cleaning pressure for cleaning a semiconductor wafer.

Typically, the cleaning temperature is about 50–85° C. (122–185° F.), such as about 66° C. (151° F.), the initial lower temperature of the first portion of deionized water is about 15–30° C. (59–86° F.), such as about 25° C. (77° F.), the initial higher temperature of the second portion of deionized water is about 60–95° C. (140–203° F.), such as about 80° C. (176° F.), and at least about 5° C. (9° F.) higher than the cleaning temperature, and the cleaning pressure is about atmospheric pressure.

Preferably, the second portion of deionized water has a substantially 100% saturated initial concentration of the gas dissolved therein, and the gas concentration of the first portion of deionized water is adjusted to provide an under-saturated adjusted concentration of the gas dissolved therein of at least about 90% and at most below substantially 100% saturated concentration.

According to a preferred feature, the method further comprises adding a chemical cleaning agent to the hot bath, such as an alkaline cleaning agent, e.g., comprising hydrogen peroxide and ammonium hydroxide, or the like, for providing a very dilute cleaning solution. Typically, the dilute cleaning solution comprises an alkaline cleaning solution of deionized $H_2O/H_2O_2/NH_4OH$, e.g., in a volume ratio of 10:1:1 to 1,000:2:1, especially 100:0.9:0.5, respectively (SC1).

According to another preferred feature, the method further comprises cleaning a semiconductor wafer by contacting the wafer with the hot bath, such as by immersing the wafer in the hot bath and applying megasonic vibrations to the hot bath.

In particular, the method comprises gassifying a first portion of deionized water having a predetermined initial concentration of the gas dissolved therein and a predetermined initial lower temperature to provide a predetermined under-saturated adjusted concentration of the gas dissolved therein at the initial lower temperature; and heating the resulting adjusted gas concentration first portion of deionized water by mixing therewith in a predetermined ratio a temperature adjusting quantity of a second portion of deionized water having a predetermined initial concentration of the gas dissolved therein and a predetermined initial higher temperature, sufficiently to form the hot bath of deionized water containing the substantially 100% saturated concentration of the gas dissolved therein at the cleaning temperature and cleaning pressure.

The non-reactive cleaning enhancing gas typically comprises nitrogen ($N_2$), helium (He), neon (Ne), argon (Ar), krypton (Kr), xenon (Xe), radon (Rn), hydrogen ($H_2$), light hydrocarbons such as methane ($CH_4$) and ethane ($C_2H_6$), light perfluorinated hydrocarbons such as tetrafluoromethane (carbon tetrafluoride, $CF_4$), light ethers such as dimethyl ether ($CH_3OCH_3$), light fluorinated ethers, and the like. Where mildly acidic pH is not a problem, the gas can even be carbon dioxide ($CO_2$), and where some oxidative activity is not a problem, the gas can even be nitrous oxide (laughing gas ($N_2O$)).

However, the non-reactive cleaning enhancing gas and deionized water used are each substantially oxygen-free, and preferably essentially oxygen-free.

According to a second aspect of the invention, an apparatus arrangement is provided for preparing deionized water containing a substantially 100% saturated concentration of a non-reactive cleaning enhancing gas dissolved therein at a selective elevated cleaning temperature and a selective attendant cleaning pressure for cleaning a semiconductor wafer.

The arrangement comprises a gassifier chamber flow connected to a first flow controller means; the first flow controller means being flow connected to liquid mixing means for supplying a gas concentration adjusted first liquid thereto from the chamber; first liquid inlet means for supplying the first portion of liquid at a first predetermined temperature and a first predetermined concentration of gas dissolved therein to the chamber; gas inlet means for supplying gas to the chamber; pressure applying means flow connected to the gas inlet means for supplying the gas to the chamber at a selectively adjusted pressure; and pressure sensing means for sensing the pressure in the chamber.

The arrangement further comprises second flow controller means flow connected to the mixing means for supplying a second portion of the liquid at a second predetermined temperature and a second predetermined concentration of gas dissolved therein to the mixing means; and temperature sensing means for sensing the temperature of liquid in said mixing means.

Control means are connected to the pressure applying means, pressure sensing means, temperature sensing means, first flow controller means and second flow controller means for controlling the operation of the pressure applying means for selectively adjusting the pressure in the chamber and the operation of the first and second flow controller means for selectively adjusting the respective flows of the first and second liquids through the mixing means, for providing resultant mixed liquid corresponding to a hot bath of deionized water at a selective adjusted concentration of gas dissolved therein and at a selective elevated temperature and attendant pressure.

According to a preferred feature, the arrangement further comprises a cleaning tank arranged to receive the resultant mixed liquid from the mixing means for megasonic cleaning of a semiconductor wafer.

The invention will be more readily understood from the following detailed description taken with the accompanying drawings and claims.

BRIEF DESCRIPTION OF THE DRAWINGS

FIG. 1 is a schematic view illustrating an apparatus arrangement for preparing gassified and heated deionized water for megasonic cleaning of semiconductor wafers in accordance with the present invention;

FIG. 2 is a graph showing silicon nitride particle removal efficiency in deionized water as a function of nitrogen gas concentration at 25° C. constant temperature; and FIG. 3 is a graph showing optimum nitrogen gas concentration at 1 atmosphere constant pressure for deionized water at different temperatures.

It is noted that the drawings are not to scale, some portions being shown exaggerated to make the drawings easier to understand.

DETAILED DESCRIPTION

Referring now to FIG. 1, there is shown an apparatus arrangement 10 for preparing deionized water containing a 100% saturated concentration of a non-reactive cleaning enhancing gas dissolved therein at a selective elevated (hot) cleaning temperature and a selective attendant cleaning pressure to form a hot bath for cleaning a semiconductor wafer, e.g., of silicon, in accordance with the present invention. The arrangement 10 comprises a gassifier chamber 11, a first flow controller 12, a mixer 13, a cleaning tank 14, a pressure pump 17, a pressure sensor 19, a temperature sensor 20, a second flow controller 21, a controller 22, a pump control line 23, a pressure control line 24, a first flow controller control line 25, a temperature control line 26, a second flow controller control line 27, and a chemicals feeder 28. Chamber 11 has a water inlet 15 and a gas inlet 16, and pump 17 has a gas intake 18.

Gassifier chamber 11 is flow connected to first flow controller 12, e.g., formed as a first metering valve, which in turn is flow connected to mixer 13, e.g., formed as a mixing valve. Second flow controller 21, e.g., also formed as a metering valve, is likewise flow connected to mixer 13.

Mixer 13 is arranged to receive a first portion of deionized water at a predetermined initial lower (cold) temperature from gassifier chamber 11 at a first predetermined volume flow rate, e.g., 2.55 gal/min., controlled by first flow controller 12, and a second portion of deionized water at a predetermined initial higher (very hot) temperature at a second predetermined volume flow rate, e.g., 7.45 gal/min., controlled by second flow controller 21, for mixing therein in a predetermined volume ratio (e.g., 25.5% cold portion to 74.5% very hot portion) to provide, e.g., at a flow rate of 10 gal/min., the desired hot deionized water such as at a cleaning temperature of about 50–85° C., e.g. 66° C. Cleaning tank 14 is arranged in conventional manner to receive the hot deionized water from mixer 13, such as for effecting batch operation cleaning of one or more semiconductor wafers (not shown).

Gassifier chamber 11 is suitably provided as a conventional degassifier/gassifier chamber, i.e., a closed, e.g., hermetically sealed, chamber divided by a gas permeable membrane (not shown) into a liquid compartment (water space) and a gas compartment (gas space). When used as a gassifier, chamber 11 has the water inlet 15 for supplying water thereto and the gas inlet 16 for supplying gas thereto. Gas is supplied to the gas space by pressure pump 17 and in turn via the membrane to the water at a selective positive pressure to adjust the concentration of the gas dissolved in the water by increasing such concentration.

Water inlet 14 is connected to a first source of deionized water (not shown) for maintaining the water space of degassifier chamber 11 completely filled with a first portion of deionized water. This first portion of deionized water is desirably essentially oxygen-free, e.g., cold deionized water having a predetermined initial concentration, such as about 48% (8 ppm), of non-reactive cleaning enhancing (bubble generating and agitating) gas, e.g., nitrogen gas ($N_2$), dissolved therein and a predetermined initial lower temperature of about 15–30° C., and particularly at ambient or room temperature such as about 25° C.

The first source of deionized water is typically deionized water which has been preliminarily degassified to remove all gases therefrom in order to render the water free from oxygen. The essentially oxygen-free deionized water is stored in a reservoir typically maintained at about room temperature such as about 15–30° C., e.g., 25° C., covered by a blanket of inert gas such as nitrogen, under a pressure head or pump pressure sufficient to effect flow to degassifier 11. Storage under such conditions serves to gassify the cold deionized water with the inert gas such as nitrogen, e.g., to said 48% (8 ppm) saturation.

Gas intake 18 of pressure pump 17 is connected to a source of the non-reactive cleaning enhancing gas, such as a cylinder of nitrogen gas (not shown), for supplying such gas to gassifier chamber 11. For this purpose, pressure pump 17 is connected to gas inlet 16 of gassifier chamber 11. Pressure sensor 19 is in communication with the gas space of gassifier chamber 11 to sense and monitor the pressure, i.e., partial pressure at equilibrium, of the nitrogen gas therein.

Pressure pump 17 is operated in conjunction with pressure sensor 19 for maintaining the gas space of gassifier chamber 11 at a selective positive pressure. This causes dissolution of a selective amount of the nitrogen gas into the water in the water space of gassifier chamber 11 by passing through the membrane from the gas space for adjusting the concentration of the gas dissolved in the deionized water in gassifier chamber 11.

The gas concentration of such first portion of deionized water is thus increased to provide an under-saturated adjusted concentration of the nitrogen gas dissolved therein, such as from 48% (8 ppm) to at least about 90% and at most below substantially 100% saturated concentration, e.g., about 95.4% (15.8 ppm) gas saturation.

Second flow controller 21 is connected to a second source of deionized water (not shown), also desirably essentially oxygen-free, and having a predetermined initial concentration, such as substantially 100% (8 ppm), of the nitrogen gas dissolved therein and a predetermined initial higher (very hot) temperature of about 60–95° C., e.g. about 80° C., and at least about 5° C. higher than the 50–85° C. cleaning temperature.

The second source of deionized water is also typically deionized water which has been preliminarily degassified to remove all gases therefrom in order to render the water free from oxygen. The essentially oxygen-free deionized water is then heated to a very hot temperature such as about 60–95° C., e.g., 80° C., and stored at that very hot temperature in a reservoir, covered by a blanket of inert gas such as nitrogen, under a pressure head sufficient to facilitate flow to second flow controller 21. Storage under such conditions serves to gassify the very hot deionized water with the inert gas such as nitrogen, e.g., to said 100% (8 ppm) gas saturation.

Second flow controller 21 is arranged for feeding a second portion of the initial substantially 100% (8 ppm) saturated gas concentration, very hot (60–95° C., e.g., 80° C.) deionized water to mixer 13 in a predetermined volume ratio (7.45 gal/min.) with the first portion (2.55 gal/min.) of the 95.4% (15.8 ppm) adjusted gas concentration, cold (15–30° C., e.g., 25° C.) deionized water fed from gassifier chamber 11 via first flow controller 12.

In this way, the cold and very hot water portions are blended to provide a resultant hot bath of (10 gal/min.) deionized water at substantially 100% (16.6 ppm) saturated concentration of the nitrogen gas dissolved therein at a 50–85° C., e.g., 66° C., cleaning temperature, and an attendant cleaning pressure, e.g., atmospheric pressure. Temperature sensor 20 is arranged to sense and monitor the temperature of the deionized water in mixer 13.

Hence, assuming a central or local supply of cold deionized water at 25° C. having a 48% (8 ppm) nitrogen gas concentration and a central or local supply of very hot deionized water at 80° C. having a 100% (8 ppm) nitrogen gas concentration, and local gas concentration adjustment at the wet cleaning tool, of the water to provide a flow rate of 10 gal/min. for forming a hot cleaning bath at 66° C. having a 100% (10 ppm) saturated gas concentration, the cold water is gassified with nitrogen from 48% (8 ppm) to 95.4% (15.8 ppm) concentration and mixed at a flow rate of 2.55 gal/min. with the very hot water at a flow rate of 7.45 gal/min. It is clear that the gas concentration adjustment and temperature adjustment are dependent on the flow rates of the cold and very hot water portions.

Thus, for a cold deionized water supply having a temperature of 25° C. and an absolute nitrogen gas concentration of 8 ppm (48% saturation), a very hot deionized water supply having a temperature of 80° C. and an absolute nitrogen gas concentration of 8 ppm (100% saturation), and a cleaning bath deionized water which is to have a flow rate of 10 gal/min. and is to be hot deionized water having a temperature of 66° C. and an absolute nitrogen gas concentration of 10 ppm (100% saturation), the flow rate x of the very hot deionized water is calculated as follows:

$$80x+25(1-x)=66(1); \text{ such that } 80x+25-25x=66; 55x=41; \text{ and } x=0.745 \text{ or } 74.5\%, \text{ i.e., } 7.45 \text{ gal/min.}$$

The flow rate (1−x) of the cold deionized water is therefore 0.255 or 25.5%, i.e., 2.55 gal/min.

Concordantly, for the proper ppm nitrogen gas concentration blend with the very hot deionized water to be achieved, the cold deionized water must be gassified to an absolute nitrogen gas concentration y of about 15.8 ppm (95.4%), calculated as follows:

$$8(0.745)+y(0.255)=10(1); \text{ such that } 5.96+0.255y=10; 0.255y=4.04; \text{ and } y=15.8.$$

Assuming the same conditions as stated above except that the temperature of the hot deionized water bath is to be 60° C. instead of 66° C., which per the saturation curve of FIG. 3 corresponds to a nitrogen gas concentration of about 11 ppm (100%), the flow rate x of the very hot deionized water is calculated as follows:

$$80x+25(1-x)=60(1); \text{ such that } 80x+25-25X=60; 55x=35; \text{ and } x=0.636 \text{ or } 63.6\%, \text{ i.e., } 6.36 \text{ gal/min.}$$

The flow rate (1−x) of the cold deionized water thus becomes 0.364 or 36.4%, i.e. 3.64 gal/min., and the cold deionized water must be gassified to a gas concentration y of about 16.2 ppm, calculated as follows:

$$8(0.636)+y(0.364)=11(1); \text{ such that } 5.09+0.364y=11; 0.364y=5.91 \text{ and } y=16.2.$$

Similarly, assuming the same conditions as stated above except that the temperature of the hot deionized water bath is to be 70° C. instead of 66° C., which per the saturation curve of FIG. 3 corresponds to a nitrogen gas concentration of about 9 ppm (100%), the flow rate x of the very hot deionized water is calculated as follows:

$$80x+25(1-x)=70(1); \text{ such that } 80x+25-25X=70; 55x=45; \text{ and } x=0.818 \text{ or } 81.8\%, \text{ i.e., } 8.18 \text{ gal/min.}$$

The flow rate (1−x) of the cold deionized water thus becomes 0.182 or 18.2%, i.e. 1.82 gal/min., and the cold deionized water must be gassified to a gas concentration y of about 13.5 ppm, calculated as follows:

$$8(0.818)+y(0.182)=9(1); \text{ such that } 6.54+0.182y=9; 0.182y=2.46; \text{ and } y=13.5.$$

Hence, based on the requested flow rate and temperature of the 100% saturated gas concentration hot deionized water bath to be prepared, and the known absolute gas concentration and temperature of the cold deionized water and also of the very hot deionized water, the volume ratio or flow rates of the cold and very hot deionized water portions can be readily calculated, and in turn the absolute gas concentration to which the cold deionized water must be raised to provide the desired 100% saturated gas concentration hot deionized water bath per the pertinent volume ratio blending of the cold and very hot deionized water portions.

Cleaning tank 14 is suitably provided at a selective cleaning pressure, e.g., about atmospheric pressure (1 atmosphere), desirably by being arranged as a closed tank or cell to avoid extraneous contamination, e.g., in indirect communication with or otherwise maintained at the ambient atmosphere in conventional manner. Cleaning tank 14 is provided with a megasonic transducer such as a megasonic vibration generator (not shown), in conventional manner for imparting or applying megasonic vibrations to cleaning tank 14 and in turn to hot deionized water received in cleaning tank 14 from mixer 13, e.g., in the form of a hot liquid bath at a hot cleaning temperature of about 50–85° C., and particularly about 66° C., at an attendant cleaning pressure, e.g., atmospheric pressure.

Controller 22 is connected via pump control line 23, pressure control line 24, first flow controller control line 25, temperature control line 26 and second flow controller control line 27, to pressure pump 17, pressure sensor 19, first flow controller 12, temperature sensor 20 and second flow controller 21, respectively, in conventional manner for controlling the operation of pressure pump 17, first flow controller 12 and second flow controller 21. Controller 22 is thereby used for selectively adjusting the gas pressure in gassifier chamber 11 and the flow rates of first flow controller 12 and second flow controller 21 for selectively mixing the first and second portions of deionized water in mixer 13 to provide the hot deionized water in cleaning tank 13 used to form the hot bath for megasonic cleaning of semiconductor wafers.

The hot liquid bath in cleaning tank 14 may be used as an aqueous chemical treatment bath of the usual chemical agents or constituents in deionized water in desired ratio, e.g., by volume (standard cleaning solution), such as a very dilute alkaline solution of hydrogen peroxide and ammonium hydroxide in deionized water in selective proportions (SC l), e.g., deionized $H_2O/H_2O_2/NH_4OH$ in a volume ratio of 10:1:1 to 1,000:2:1, especially 100:0.9:0.5, respectively, in known manner.

For this purpose, chemicals feeder 28 is provided in operative relation to cleaning tank 14 to add such chemical agents or constituents to the hot liquid bath therein in conventional manner upon transfer of the hot bath thereto from mixer 13.

Gassifier chamber 11 and mixer 13 may be arranged to receive and process the cold first and very hot second portions of deionized water from corresponding central supplies or from local sources, for gassifying the cold first portion to adjust its concentration of nitrogen or other appropriate gas therein and for heating the adjusted gas concentration first portion by mixing it in proper proportions with the very hot second portion to achieve the desired hot temperature for use in semiconductor wafer batch cleaning operations, e.g., in one or more cleaning tanks 13, including sequential individual rinsing and cleaning treatments of such wafer or wafers.

Thus, in accordance with the present invention, a temperature dependent adjustment of the partial pressure of the cleaning enhancing gas, e.g., nitrogen, in the cold deionized water is effected in gassifier chamber 11. Upon blending with the very hot deionized water in mixer 13, this results in the preparation of hot deionized water having the desired 100% saturated gas concentration therein at equilibrium for efficient use in chemical cleaning operations as well as deionized water rinsing operations, especially in connection with megasonic cleaning of silicon wafers in cleaning tank 14.

At a constant hot temperature, e.g., of 66° C., the cleaning efficiency reaches a maximum at the equilibrium gas concentration of the particular liquid/gas system. At higher gas concentration in a non-equilibrium state, as normally occurs in practice, the cleaning efficiency decreases. Thus, conventional deionized water preparation systems using the processing sequence of gassifier −> temperature adjuster −> processing chamber, i.e., cleaning tank, allow optimum megasonic efficiency only if the gassification level of the gassifier is temperature controlled.

This is because the solubility of gases decreases with increasing temperature. Thus, a gassification of comparatively cold deionized water and admixture thereof with comparatively very hot deionized water is needed for providing the desired deionized water cleaning bath at a comparatively hot temperature. Since conventional deionized water preparation systems do not control the cold deionized water gassification in dependence upon the elevated temperature of the hot deionized water used for the ensuing cleaning operation, the megasonic vibration efficiency is optimal only for one given cleaning process temperature.

Referring now to FIG. 2, there is shown a graph with Silicon Particle Removal Efficiency (%) on the y-axis (ordinate) and Pressure (atm) on the x-axis (abscissa). This graph illustrates the effect of gas over-saturated and under-saturated deionized water on semiconductor wafer cleaning efficiency using nitrogen as the gas dissolved in the deionized water.

In this particle removal efficiency test, following the usual practice, a silicon wafer is first contaminated with test particles, in this case silicon nitride particles, in a reproducible manner. Then the number of deposited test particles is measured. Particle removal efficiency is calculated in terms of the amount of particles removed based on the known starting quantity of particles used.

It is considered that the nature of the test particles on the wafer surface is very different from the actual particles expected to be present on the wafer surface during the manufacturing process. However, the test serves as an accepted measure of cleaning efficiency for a given cleaning tool. In general, it can be assumed that the actual particles on the wafer surface encountered in the manufacturing process are more strongly attached to the wafer surface and therefore more difficult to remove than the test particles.

FIG. 2 shows the particle removal efficiency of the contaminating silicon nitride particles as a function of nitrogen gas concentration, i.e., removal efficiency =f(p), or stated another way, as a function of the partial pressure of the gas, which is the equivalent of the gas concentration. The experimental conditions include a constant temperature of 25° C. and a gas partial pressure ranging between about 0.6–1.4 atmospheres, for deionized water adjusted as to its dissolved nitrogen gas content, i.e., degassified or gassified, using a conventional Hoechst Celanese contactor as gas adjustment component (degassifier or gassifier), with megasonic wet cleaning operations carried out in a CFM 8050 system (CFM Technologies Inc.) as wet cleaning tool, at 25° C., using a wet cleaning process with a SC1 solution (100:0.9:0.5; deionized water: hydrogen peroxide: ammonium hydroxide) for 60 seconds at a pressure of 1 atmosphere.

The vertical dashed line in FIG. 2 signifies normal or ambient atmospheric pressure (1 atm), such that the concentration of the gas to the left of the vertical dashed line signifies under-saturation at negative pressures below atmospheric pressure, while the concentration of the gas to the right of the vertical dashed line signifies over-saturation (super-saturation) at positive pressures above atmospheric pressure.

FIG. 2 makes clear that at atmospheric pressure of nitrogen (100% saturation equilibrium), the highest particle removal efficiency is observed. At both lower and higher gas concentrations, the cleaning efficiency significantly decreases.

The drop in particle removal efficiency at over-saturated nitrogen in deionized water can be explained by the formation of excessive bubbles of the gas (nitrogen) which detrimentally absorb the megasonic energy before it reaches the wafer surface.

The decrease in particle removal efficiency at lower gas concentrations is believed due to the fact that stable cavitation is reduced at lower equilibrium gas concentrations. This has apparently not been appreciated up to now by those in the art.

It is noted that in order to make clearly visible the effect of dissolved gas concentration on cleaning efficiency, the removal efficiency had to be adjusted to be lower than 100% (i.e., 70%), thus enabling one to follow the impact thereon of the dissolved gas concentration. For this reason, the experiments carried out herein were conducted with very dilute SC1 solutions (i.e., 100:0.9:0.5; deionized water: hydrogen peroxide: ammonium hydroxide) for short cleaning times (i.e., 60 seconds), at ambient temperature (i.e., 25° C.). In general, cleaning efficiency increases with increasing concentration of solution chemicals, increasing cleaning time, and increasing temperature.

Referring now to FIG. 3, there is shown a graph with Nitrogen ($N_2$) in parts per million (ppm) on the y-axis and Temperature in degrees C. (°C.) on the x-axis. This graph illustrates the optimum nitrogen gas concentration in ppm for deionized water at different temperatures between about 15–75° C. at a constant total pressure of dissolved nitrogen of 1 atmosphere. Thus, the optimum equilibrium concentration is the equilibrium gas concentration as exemplified for nitrogen in FIG. 3. The three left, middle and right vertical dashed lines in FIG. 3 signify temperatures of 25 ° C., 29° C. and 66° C., respectively, while the three upper, middle and lower horizontal dashed lines signify dissolved nitrogen concentrations in deionized water of 18 ppm, 16.6 ppm and 10 ppm, respectively.

The saturation curve of FIG. 3 indicates that 100% nitrogen gas saturation corresponds to about 18 ppm (top horizontal dashed line) at 25° C. (left vertical dashed line), to about 16.6 ppm (middle horizontal dashed line) at 29° C. (middle vertical dashed line), and to about 10 ppm (bottom horizontal dashed line) at 66° C. (right vertical dashed line). Hence, heating 18 ppm nitrogen containing deionized water from 25° C. to 66° C., or 16.6 ppm nitrogen containing deionized water from 29° C. to 66° C., will result in severe over-saturation of nitrogen in the heated deionized water On the other hand, heating 10 ppm nitrogen containing deionized water from 25° C. to 66° C., or from 29° C. to 66° C., will result in desired 100% saturation of nitrogen in the heated deionized water.

As is clear from the saturation curve in FIG. 3, the 16.6 ppm nitrogen containing water at 25° C. amounts to about 90% saturation at equilibrium, signifying a nitrogen under-saturated condition. As is also clear from the curve in FIG. 3, the 16.6 ppm concentration corresponds to more than 60% over-saturation at equilibrium compared to 10 ppm of nitrogen gas (i.e., 16.6−10=6.6; 6.6/10=66%), upon heating the deionized water from 25° C. to 66° C.

Referring again to FIG. 2, it is seen that this more than 60% over-saturation reduces the nitride particle removal efficiency performance by more than 30%. As shown in FIG. 2, about 70% particle removal efficiency is attained at 1.0 atmosphere pressure (which is equivalent to 100% nitrogen saturation in the deionized water). On the other hand, only about 40% particle removal efficiency is attained at 0.8 atmosphere pressure (under-saturated nitrogen concentration in the deionized water), while only about 65% particle removal efficiency is attained at 1.2 atmosphere pressure (over-saturated nitrogen concentration in the deionized water).

As noted above, when the nitrogen gas dissolved in the deionized water is under-saturated in concentration (i.e., below 100% normal saturation), desirable stable cavitation is reduced, and when the nitrogen gas dissolved in the deionized water is over-saturated in concentration (i.e., above 100% normal saturation), excessive bubble formation occurs which adversely absorbs megasonic energy, so as to decrease in both cases the efficiency of the applied megasonic vibrations.

Thus, as is clear from FIGS. 2 and 3, to provide hot deionized water at 66° C. containing nitrogen gas therein at saturation concentration (100% normal saturation) at atmospheric pressure (1 atm), the deionized water used should be adjusted to contain 10 ppm of nitrogen gas, so that upon adjusting the temperature of the water to 66° C., the desired saturated nitrogen gas concentration will be attained.

Accordingly, the curve in FIG. 2 establishes that megasonics assisted particle removal is most effective when the total gas concentration in the dilute SC1 solution is substantially at its 100% saturation value at the selected process temperature. In turn, the curve in FIG. 3 establishes that the saturation concentration of nitrogen gas at a pressure of 1 atmosphere, i.e., the usual pressure at which the particle removal cleaning operations are carried out, is a strong function of the solution temperature. Hence, by inference, it is seen that the gas concentration in the dilute SC1 solution used must be readjusted in dependence upon the process temperature to be used in a given case, so as to maximize the efficiency of the applied megasonics.

Also, because of different processing that may be used to prepare the starting first and second portions of deionized water, the total amount of dissolved gases can vary widely at the pertinent central or local manufacturing sites serving as the sources of the first and second portions of deionized water. Thus, without additional deionized water gas concentration adjustment as contemplated herein, the applied megasonics cleaning operation would not attain the efficiencies achievable in accordance with the present invention.

It is clear from the above that while the exact mechanism by which megasonics assisting techniques enhance the particle removal operation is not fully understood at this time, the amount of dissolved gases in the cleaning solution is critical for the contemplated effective cleaning, i.e., particle removal. Cleaning tank 14 may take any conventional form for use in processing one or more semiconductor wafers by way of given rinsing steps using deionized water containing nitrogen or other appropriate gas therein, and/or chemical cleaning steps using deionized water containing one or more suitable chemical cleaning agents in addition to nitrogen or other appropriate gas therein.

In cleaning wafers, e.g., of silicon, the contemplated dilute SC1 cleaning step may be preceded or followed by other chemical steps as may be necessary. These include in a typical cleaning sequence use of etchants such as a dilute HF solution, e.g., to remove top layer silicon oxides to yield a hydrophobic silicon surface; a SC2 solution such as a mixture of deionized water, hydrogen peroxide and hydrochloric acid, i.e., after the SC1 cleaning step herein, e.g., to remove metallic contaminants deposited in the SC1 step; and/or an oxidizing solution such as a mixture of sulfuric acid with ozone or hydrogen peroxide, or dissolved ozone in water, i.e., usually before the SC1 step, e.g., to remove organic contaminants.

Each such chemical process step is usually followed by a wafer rinsing step using deionized water to remove the residual process chemicals. After all chemical steps and rinsing steps are completed, the wafer is dried. The post chemical process final rinsing step may be carried out at elevated temperature, and may incorporate megasonics assistance for enhanced chemical diffusion/migration efficiency.

On the one hand, according to the present invention, two portions of deionized water are used, the first portion having an initial cold temperature lower than the hot cleaning temperature, and the second portion having an initial very hot temperature higher than the hot cleaning temperature and which is mixed with the first portion in proportions to achieve a mixture at the cleaning temperature. On the other hand, according to the invention of said simultaneously filed patent application, one portion of deionized water is used having an initial cold temperature lower than the hot cleaning temperature and which is heated to the cleaning temperature.

It is noted that said U.S. Pat. No. 5,800,626 contains in Table 1 thereof results of tests carried out with SC-1 cleaning solutions of $H_2O/H_2O_2/NH_4OH$ at volume ratios of 40:2:1, 80:3:1 and 240:3:1, and temperatures of 45° C., 65° C., 22° C. and 23° C. at nitrogen gas saturations which were only estimated to be 50% or 100% saturations. These estimated saturation results, however, are based on tests that did not involve selective temperature dependent gas concentration adjustment of deionized water in the manner of the present invention.

Accordingly, it can be appreciated that the specific embodiments described are merely illustrative of the general principles of the invention. Various modifications may be provided consistent with the principles set forth.

What is claimed is:

1. A method for preparing deionized water containing a substantially 100% saturated concentration of a non-reactive cleaning enhancing gas dissolved therein at a selective elevated cleaning temperature and a selective attendant cleaning pressure for cleaning a semiconductor wafer, the method comprising the steps of:

adjusting the dissolved non-reactive cleaning enhancing gas concentration of a first portion of deionized water having a predetermined initial concentration of said gas dissolved therein and a predetermined initial lower temperature to provide a predetermined under-saturated adjusted concentration of said gas dissolved therein at said initial lower temperature; and adjusting the temperature of the resulting adjusted gas concentration first portion of deionized water by mixing therewith in a predetermined ratio a temperature adjusting quantity of a second portion of deionized water having a predetermined initial concentration of said gas dissolved therein and a predetermined initial higher temperature, sufficiently to form a hot bath of deionized water containing said substantially 100% saturated concentration of said gas dissolved therein at said cleaning temperature and said cleaning pressure for cleaning a semiconductor wafer.

2. The method of claim 1 wherein said cleaning temperature is about 50–85° C., said initial lower temperature of said first portion of deionized water is about 15–30° C., said initial higher temperature of said second portion of deionized water is about 60–95° C. and at least about 5° C. higher than said cleaning temperature, and said cleaning pressure is about atmospheric pressure.

3. The method of claim 1 wherein said second portion of said deionized water has a substantially 100% saturated initial concentration of said gas dissolved therein, and the gas concentration of said first portion of deionized water is adjusted to provide an under-saturated adjusted concentration of said gas dissolved therein of at least about 90% and at most below substantially 100% saturated concentration.

4. The method of claim 1 further comprising adding a chemical cleaning agent to said hot bath.

5. The method of claim 1 further comprising adding a chemical cleaning agent comprising hydrogen peroxide and ammonium hydroxide to said hot bath.

6. The method of claim 1 further comprising adding a chemical cleaning agent comprising hydrogen peroxide and ammonium hydroxide to said hot bath to provide a volume ratio of deionized water to hydrogen peroxide to ammonium hydroxide of about 10:1:1 to 1,000:2:1.

7. The method of claim 1 further comprising cleaning a semiconductor wafer by contacting said wafer with said hot bath.

8. The method of claim 1 further comprising cleaning a semiconductor wafer by immersing said wafer in said hot bath and applying megasonic vibrations to said hot bath.

9. A method for preparing deionized water containing a substantially 100% saturated concentration of a non-reactive cleaning enhancing gas dissolved therein at a selective elevated cleaning temperature of about 50–85° C. and a selective attendant cleaning pressure of about atmospheric pressure for cleaning a semiconductor wafer, the method comprising the steps of:

adjusting the dissolved non-reactive cleaning enhancing gas concentration of a first portion of deionized water having a predetermined initial concentration of said gas dissolved therein and a predetermined initial lower temperature of about 15–30° C. to provide a predetermined under-saturated adjusted concentration of said gas dissolved therein at said initial lower temperature;

adjusting the temperature of the resulting adjusted gas concentration first portion of deionized water by mixing therewith in a predetermined ratio a temperature adjusting quantity of a second portion of deionized water having a predetermined initial concentration of said gas dissolved therein and an initial higher temperature of about 60–95° C. and at least about 5° C. higher than said cleaning temperature, sufficiently to form a hot bath of deionized water containing said substantially 100% saturated concentration of said gas dissolved therein at said cleaning temperature and said cleaning pressure for cleaning a semiconductor wafer; and immersing said wafer in said hot bath and applying megasonic vibrations to said bath for cleaning said wafer.

10. The method of claim 9 wherein said second portion of said deionized water has a substantially 100% saturated initial concentration of said gas dissolved therein, and the gas concentration of said first portion of deionized water is adjusted to provide an under-saturated adjusted concentration of said gas dissolved therein of at least about 90% and at most below substantially 100% saturated concentration.

11. The method of claim 9 further comprising adding a chemical cleaning agent to said hot bath.

12. The method of claim 9 further comprising adding a chemical cleaning agent comprising hydrogen peroxide and ammonium hydroxide to said hot bath.

13. The method of claim 9 further comprising adding a chemical cleaning agent comprising hydrogen peroxide and ammonium hydroxide to said hot bath to provide a volume ratio of deionized water to hydrogen peroxide to ammonium hydroxide of about 10:1:1 to 1,000:2:1.

14. A method for preparing deionized water containing a substantially 100% saturated concentration of a non-reactive cleaning enhancing gas dissolved therein at a selective elevated cleaning temperature and a selective attendant cleaning pressure for cleaning a semiconductor wafer, the method comprising the steps of:

gassifying a first portion of deionized water having a predetermined initial concentration of non-reactive cleaning enhancing gas dissolved therein and a predetermined initial lower temperature to provide a predetermined under-saturated adjusted concentration of said gas dissolved therein at said initial lower temperature; and heating the resulting adjusted gas concentration first portion of deionized water by mixing therewith in a predetermined ratio a temperature adjusting quantity of a second portion of deionized water having a predetermined initial concentration of said gas dissolved therein and a predetermined initial higher temperature, sufficiently to form a hot bath of deionized water containing said substantially 100% saturated concentration of said gas dissolved therein at said cleaning temperature and said cleaning pressure for cleaning a semiconductor wafer.

15. The method of claim 14 wherein said cleaning temperature is about 50–85° C., said initial lower temperature of said first portion of deionized water is about 15–30° C., said initial higher temperature of said second portion of deionized water is about 60–95° C. and at least about 5° C. higher than said cleaning temperature, and said cleaning pressure is about atmospheric pressure.

16. The method of claim 14 wherein said second portion of said deionized water has a substantially 100% saturated initial concentration of said gas dissolved therein, and the gas concentration of said first portion of deionized water is adjusted to provide an under-saturated adjusted concentration of said gas dissolved therein of at least about 90% and at most below substantially 100% saturated concentration.

17. The method of claim 14 further comprising adding a chemical cleaning agent to said hot bath.

18. The method of claim 14 further comprising adding a chemical cleaning agent comprising hydrogen peroxide and ammonium hydroxide to said hot bath.

19. The method of claim 14 further comprising adding a chemical cleaning agent comprising hydrogen peroxide and ammonium hydroxide to said hot bath to provide a volume ratio of deionized water to hydrogen peroxide to ammonium hydroxide of about 10:1:1 to 1,000:2:1.

20. The method of claim 14 further comprising cleaning a semiconductor wafer by contacting said wafer with said hot bath.

21. The method of claim 14 further comprising cleaning a semiconductor wafer by immersing said wafer in said hot bath and applying megasonic vibrations to said hot bath.

* * * * *